United States Patent
Shimizu et al.

(10) Patent No.: US 7,504,980 B2
(45) Date of Patent: Mar. 17, 2009

(54) SEMICONDUCTOR DEVICE

(75) Inventors: Yasuhide Shimizu, Nagasaki (JP); Shigemitsu Murayama, Nagasaki (JP); Kohei Kudo, Nagasaki (JP); Hiroaki Yatsuda, Nagasaki (JP)

(73) Assignee: Sony Corporation (JP)

( * ) Notice: Subject to any disclaimer, the term of this patent is extended or adjusted under 35 U.S.C. 154(b) by 262 days.

(21) Appl. No.: 11/544,610

(22) Filed: Oct. 10, 2006

(65) Prior Publication Data

US 2007/0085653 A1   Apr. 19, 2007

(30) Foreign Application Priority Data

Oct. 14, 2005   (JP) .......................... P2005-299658

(51) Int. Cl.
*H03M 1/78*   (2006.01)

(52) U.S. Cl. .................. 341/154; 341/144; 341/155

(58) Field of Classification Search ................. 341/154
See application file for complete search history.

(56) References Cited

U.S. PATENT DOCUMENTS

| 4,228,418 | A | * | 10/1980 | Piedmont et al. | 338/195 |
| 4,703,302 | A | * | 10/1987 | Hino et al. | 338/293 |
| 5,680,132 | A | * | 10/1997 | Kobatake | 341/154 |
| 5,905,427 | A | * | 5/1999 | Hamasaki et al. | 338/320 |
| 6,013,940 | A | * | 1/2000 | Harada et al. | 257/538 |
| 6,307,495 | B1 | * | 10/2001 | Mahant-Shetti et al. | 341/154 |
| 7,064,023 | B2 | * | 6/2006 | Koyama et al. | 438/166 |
| 2005/0140534 | A1 | * | 6/2005 | Nishi et al. | 341/154 |

FOREIGN PATENT DOCUMENTS

JP   05-284031   10/1993

* cited by examiner

*Primary Examiner*—Khai M Nguyen
(74) *Attorney, Agent, or Firm*—Rader Fishman & Grauer PLLC; Ronald P. Kananen (57) ABSTRACT

A semiconductor device includes a semiconductor substrate and a ladder resistor formed on the semiconductor substrate. The ladder resistor includes a plurality of elongated resistor portions arranged in parallel with each other, a plurality of connection portions that connect the resistor portions at predetermined intervals in a longitudinal direction of the resistor portions, and a plurality of voltage extraction portions provided in order to extract voltages at the individual connection portions.

18 Claims, 6 Drawing Sheets

SEMICONDUCTOR DEVICE

CROSS REFERENCES TO RELATED APPLICATIONS

The present invention contains subject matter related to Japanese Patent Application JP 2005-299658 filed in the Japanese Patent Office on Oct. 14, 2005, the entire contents of which are incorporated herein by reference.

BACKGROUND OF THE INVENTION

1. Field of the Invention

The present invention relates to semiconductor devices in which a ladder resistor used in an analog-to-digital converter circuit (hereinafter, referred to as an A/D converter circuit) that converts analog data into digital data or a digital-to-analog converter circuit (hereinafter, referred to as a D/A converter circuit) that converts digital data into analog data is formed on a semiconductor substrate.

2. Description of the Related Art

In A/D converter circuits or D/A converter circuits, a ladder resistor including a plurality of resistors arranged in series with each other in order to generate a plurality of standard voltages or a plurality of reference voltages has been used. Due to recent development in integration technologies, semiconductor devices in which an A/D converter or a D/A converter that includes a ladder resistor is formed by a semiconductor process have been produced.

Figure 4A:
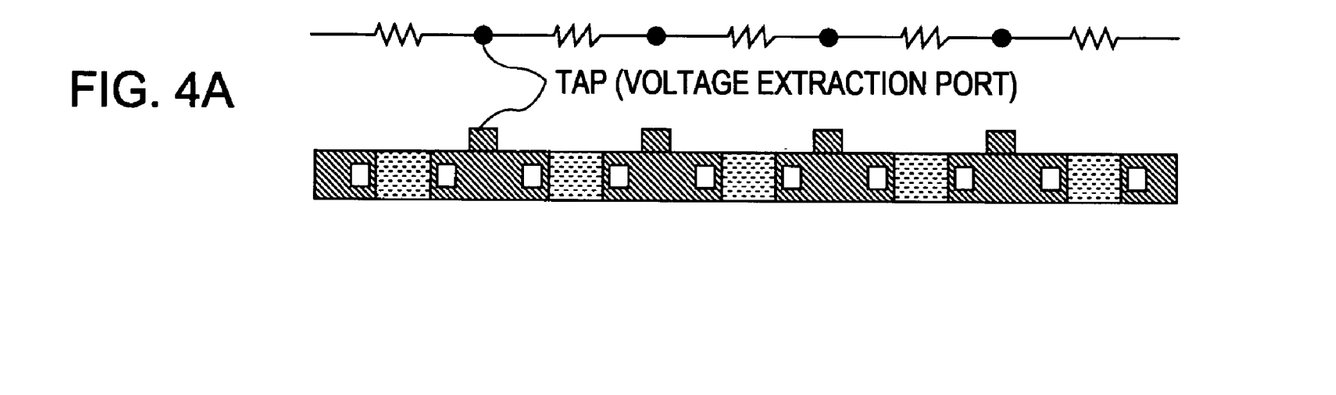
FIGS. 4A and 4B show the configuration of a known ladder resistor formed on a semiconductor substrate.
Figure 4B:
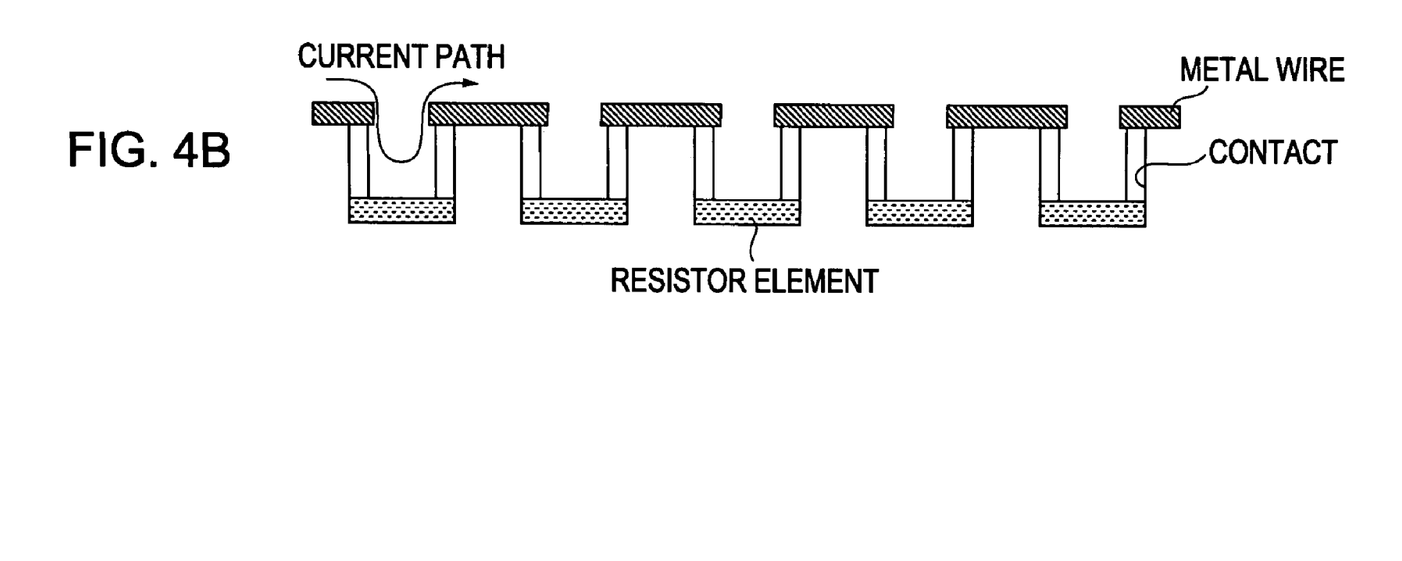
Figure 5:
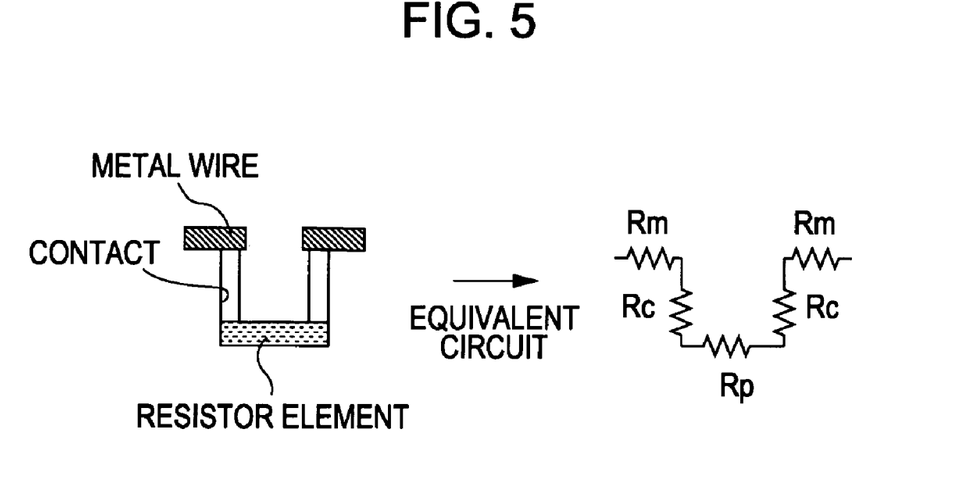
FIG. 5 shows the configuration of the ladder resistor shown in FIGS. 4A and 4B.

Such a known ladder resistor produced by the semiconductor process has a configuration in which, as shown in FIG. 4A (top view) and FIG. 4B (cross-sectional view), a plurality of metal wires, a plurality of contacts, and a plurality of resistor elements are connected in series along a current path. That is, such a ladder resistor is configured such that, as shown in FIG. 5, a plurality of unit resistors each constituted by metal wires, contacts, and a resistor element (=2×Rm+2×Rc+Rp, where "Rm" represents a metal wire resistor, "Rc" represents a contact resistor, and "Rp" represents a poly resistor) are connected in series with each other. In addition, a plurality of standard voltages or a plurality of reference voltages is extracted from between the unit resistors. When a plurality of standard voltages or a plurality of reference voltages is generated using a ladder resistor having the above-mentioned configuration, the accuracy of acquisition of the voltage division ratio is determined in accordance with variations in metal wires, contacts, and resistor elements.

Thus, when the above-mentioned ladder resistor is used, the voltage division ratio is acquired less accurately, due to the variations in the metal wires, the contacts, and the resistor elements.

Figure 6A:
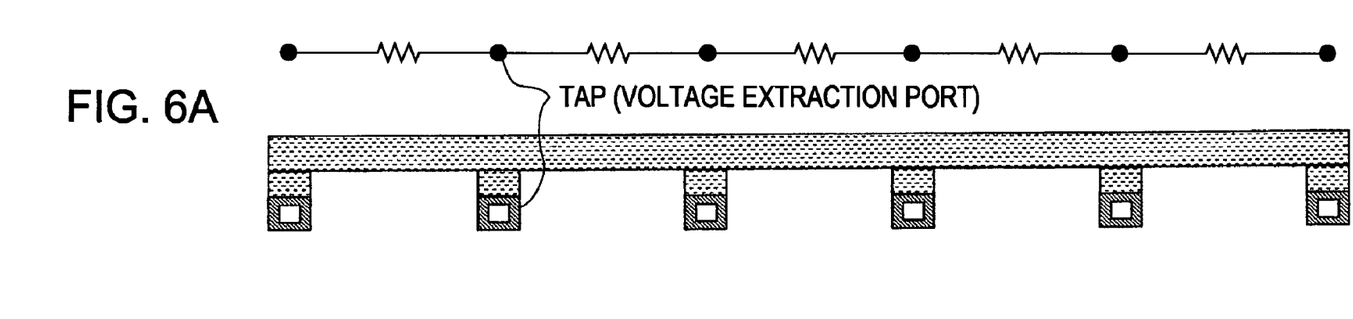
FIGS. 6A and 6B show the configuration of a known ladder resistor formed on a semiconductor substrate.
Figure 6B:
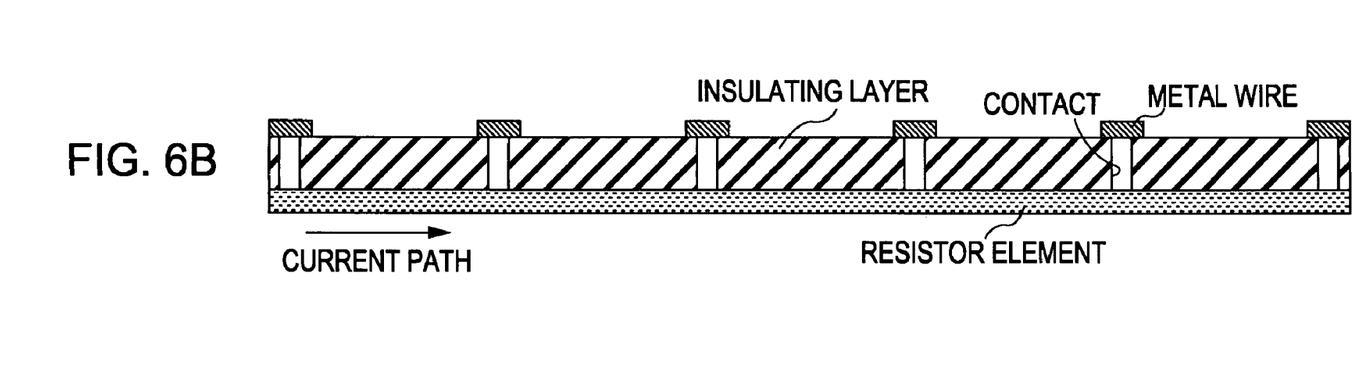

A ladder resistor configured to increase the accuracy of acquisition of the voltage division ratio is disclosed, for example, in Japanese Unexamined Patent Application Publication No. 5-284031. In the ladder resistor, as shown in FIG. 6A (top view) and FIG. 6B (cross-sectional view), in order to prevent a reduction in the accuracy of acquisition of the voltage division ratio due to the variations in metal wires and contacts, the metal wires and the contacts are provided in portions other than an area that substantially serves as a current path.

In recent years, an improvement in the resolution of A/D converter circuits or D/A converter circuits has been desired. In accordance with this, a further improvement in the accuracy of acquisition of the voltage division ratio has also been desired.

The ladder resistor described in Japanese Unexamined Patent Application Publication No. 5-284031 is also capable of preventing a reduction in the accuracy of acquisition of the voltage division ratio due to the variations in metal wires and contacts. However, in order to further improve the accuracy of acquisition of the voltage division ratio, it is necessary to improve the accuracy of acquisition of the resistance of a resistor element portion.

As a method for improving the accuracy of acquisition of the resistance of a resistor element portion, a method for increasing an area of a resistor element is considered. However, a resistor element having a large area has a weak strength against bending stress.

SUMMARY OF THE INVENTION

It is desirable to provide a semiconductor device including a ladder resistor that is capable of preventing a reduction in the accuracy of acquisition of the voltage division ratio due to the variations in metal wires and contacts and that is capable of improving the accuracy of acquisition of the resistance without reducing the strength against bending stress.

A semiconductor device according to an embodiment of the present invention includes a semiconductor substrate and a ladder resistor formed on the semiconductor substrate. The ladder resistor includes a plurality of elongated resistor portions arranged in parallel with each other, a plurality of connection portions that connect the resistor portions at predetermined intervals in a longitudinal direction of the resistor portions, and a plurality of voltage extraction portions provided in order to extract voltages at the individual connection portions.

As described above, the voltage extraction portions are provided at the connection portions that connect the resistor portions, instead of being provided at the resistor portions serving as a current path. Thus, a reduction in the accuracy of acquisition of the voltage division ratio due to the variations in metal wires and contacts can be prevented. In addition, since a unit resistor is formed of a plurality of resistor portions, the strength against bending stress and the accuracy of acquisition of the resistance can be improved.

The resistor portions and the connection portions may be formed of an identical polysilicide layer formed on the semiconductor substrate.

As described above, since the resistor portions and the connection portions are formed of an identical polysilicide layer, the resistor portions and the connection portions can be formed on the semiconductor substrate by an identical process.

The voltage extraction portions provided at the connection portions located at positions along a direction that is substantially orthogonal to the longitudinal direction of the resistor portions may be connected to each other.

When three or more resistor portions are used, a plurality of connection portions that connect the resistor portions are provided. In addition, the voltage extraction portions provided at the plurality of connection portions are connected each other. Thus, since a larger number of voltage extraction ports are provided compared with a configuration in which only one voltage extraction portion is provided for a plurality of connection portions, the resistance at each voltage extraction port can be reduced.

A semiconductor device according to an embodiment of the present invention includes a semiconductor substrate and a converter circuit that converts analog data into digital data or that converts digital data into analog data and that is formed on the semiconductor substrate. The converter circuit includes a ladder resistor. The ladder resistor includes a plurality of elongated resistor portions arranged in parallel with each other, a plurality of connection portions that connect the resistor portions at predetermined intervals in a longitudinal direction of the resistor portions, and a plurality of voltage extraction portions provided in order to extract voltages at the individual connection portions.

Accordingly, in the semiconductor device including an A/D converter circuit or a D/A converter circuit, the voltage extraction portions of the ladder resistor used in the A/D converter circuit or the D/A converter circuit are provided at the connection portions that connect the resistor portions, instead of being provided at the resistor portions serving as a current path. Thus, a reduction in the accuracy of acquisition of the voltage division ratio due to the variation in metal wires and contacts can be prevented. In addition, since a unit resistor is formed of a plurality of resistor portions, the strength against bending stress and the accuracy of acquisition of the resistance can be improved. In addition, the plurality of resistor portions are connected in parallel with each other, and many voltage extraction ports are provided. Thus, the resistance at each voltage extraction port can be reduced. In addition, the settling time of a standard voltage or a reference voltage in the A/D converter circuit or the D/A converter circuit can be reduced, thus increasing the operation speed.

DESCRIPTION OF THE PREFERRED EMBODIMENTS

In a semiconductor device according to an embodiment of the present invention, an A/D converter circuit or a D/A converter circuit that uses a ladder resistor as a standard voltage or a reference voltage is formed on a semiconductor substrate.

The A/D converter circuit that uses a ladder resistor as a reference voltage may be a flash A/D converter circuit, a subranging A/D converter circuit, or the like. In addition, the D/A converter circuit that uses a ladder resistor as a standard voltage may be a resistor ladder D/A converter circuit or the like.

The A/D converter circuit or the D/A converter circuit, which is formed on the semiconductor substrate, includes a ladder resistor. The ladder resistor includes a plurality of elongated resistor portions arranged in parallel with each other, a plurality of connection portions that connect the resistor portions at predetermined intervals in the longitudinal direction of the resistor portions, and a plurality of voltage extraction portions provided in order to extract voltages of the individual connection portions.

More specifically, in the ladder resistor according to this embodiment, the plurality of elongated resistor portions serving as a current path are arranged in a direction that intersects the longitudinal direction of the resistor portions, and the connection portions connect the resistor portions at predetermined intervals (for example, at regular intervals) in the longitudinal direction of the resistor portions. Thus, the connection portions do not serve as a current path.

That is, by providing a lattice configuration including a plurality of elongated resistor portions arranged in parallel with each other and a plurality of connection portions, when a voltage is applied in the longitudinal direction of the resistor portions, the resistor portions serve as a current path but the connection portions do not serve as a current path. In addition, voltage extraction portions are provided at the connection portions. The connection portions do not serve as a current path because both ends of a connection portion connected between adjoining resistor portions exhibit the same or substantially the same potential when a voltage is applied in the longitudinal direction of the resistor portions. Thus, no current flows to the connection portions or a current of a negligible amount flows to the connection portions.

Since the voltage extraction portions are provided at the connection portions that connect the resistor portions, instead of being provided at the resistor portions serving as a current path, a reduction in the accuracy of acquisition of the voltage division ratio due to the variations in metal wires and contacts can be prevented.

In addition, since a unit resistor is formed of a plurality of separated resistor portions, the strength against bending stress and the accuracy of acquisition of the resistance can be improved.

It is desirable that a plurality of resistor portions have the same shape and that ends of the plurality of resistor portions in the longitudinal direction be disposed with spaces therebetween on a line that intersects the longitudinal direction. With this arrangement, connection portions that connect the resistor portions can be arranged with predetermined spaces therebetween on a line that intersects the longitudinal direction of the resistor portions. If the intersection direction is equal to a direction that is substantially orthogonal to the longitudinal direction of the resistor portions, the ladder resistor can be arranged in a substantially rectangular shape or a substantially square shape.

In addition, the resistor portions and the connection portions are formed of an identical polysilicide layer. Thus, the resistor portions and the connection portions can be formed on the semiconductor substrate by the same process.

That is, after the polysilicide layer is formed on the semiconductor substrate, the polysilicide layer is patterned using a resist mask. Accordingly, the resistor portions and the connection portions can be formed on the semiconductor substrate at the same time.

When three or more resistor portions are provided, voltage extraction portions are provided at connection portions disposed with predetermined spaces therebetween in a direction that is substantially orthogonal to the longitudinal direction of the resistor portions, and the voltage extraction portions are connected to each other. That is, the voltage extraction portions provided at the connection portions disposed in the direction that is substantially orthogonal to the longitudinal direction of the resistor portions are connected to each other.

As described above, when the three or more resistor portions are provided, a plurality of voltage extraction portions are connected to each other. Thus, since a larger number of voltage extraction ports are provided compared with a case where only one voltage extraction portion is provided for a plurality of connection portions, the resistance at each voltage extraction port can be reduced.

Figure 1:
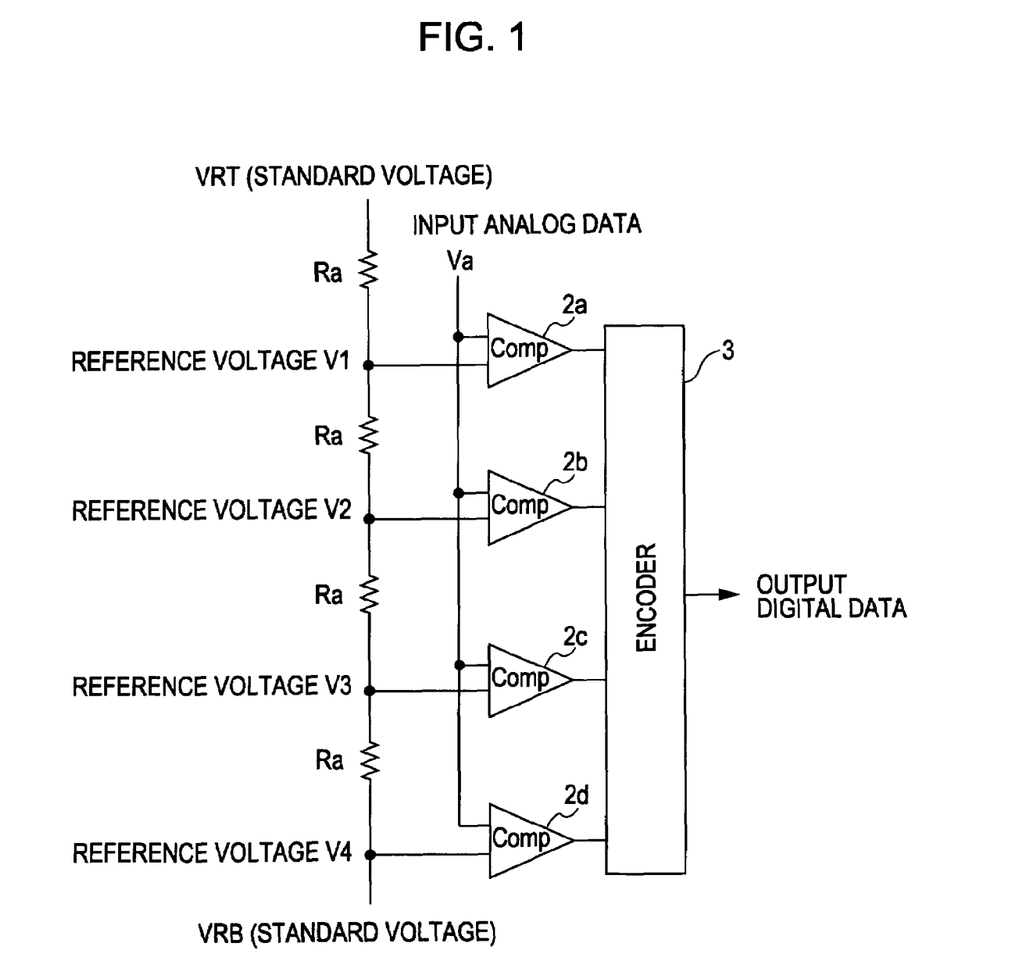
FIG. 1 shows the configuration of an A/D converter circuit according to an embodiment of the present invention.

The semiconductor device including an A/D converter circuit according to this embodiment will be described more specifically with reference to FIGS. 1, 2A, and 2B. FIG. 1 shows the schematic configuration of an A/D converter circuit, and FIG. 2A (top view) and FIG. 2B (cross-sectional view) show the configuration of a ladder resistor formed on a semiconductor substrate.

As shown in FIG. 1, the A/D converter circuit includes a ladder resistor 1 including a plurality of resistors Ra arranged in series with each other and a plurality of reference voltage extraction portions (hereinafter, referred to as "taps" or "voltage extraction portions") that extract voltages (hereinafter, referred to as "reference voltages") V1 to V4 across the resistors Ra, comparators 2a to 2d that compare the reference voltages V1 to V4 in the ladder resistor 1 with input analog data, and an encoder 3 that encodes signals output from the comparators 2a to 2d into digital data.

When standard voltages VRT and VTB are applied across the ladder resistor 1, a voltage of (VRT−VRB)/4 R is generated across each of the resistors Ra. In addition, the reference voltage V1 (V1=3(VRT−VRB)/4 R+VRB), the reference voltage V2 (V2=2(VRT−VRB)/4 R+VRB), the reference voltage V3 (V3=(VRT−VRB)/4 R+VRB), and the reference voltage V4 (V4=VRB) are acquired.

The comparator 2a compares the reference voltage V1 with the analog data, the comparator 2b compares the reference voltage V2 with the analog data, the comparator 2c compares the reference voltage V3 with the analog data, and the comparator 2d compares the reference voltage V4 with the analog data. In accordance with the results, the encoder 3 generates digital data. As described above, the A/D converter circuit generates digital data in accordance with the voltage level of the analog data.

For example, when the voltage Va of the analog data is within a range represented by the condition 2(VRT−VRB)/4 R+VRB<Va<3(VRT−VRB)/4 R+VRB, the comparator 2a outputs a signal at a low level, and the comparators 2b to 2d output signals at a high level. The encoder 3 receives the signals and generates digital data.

The ladder resistor 1 formed on the semiconductor substrate will be described more specifically with reference to FIGS. 2A and 2B.

Figure 2A:
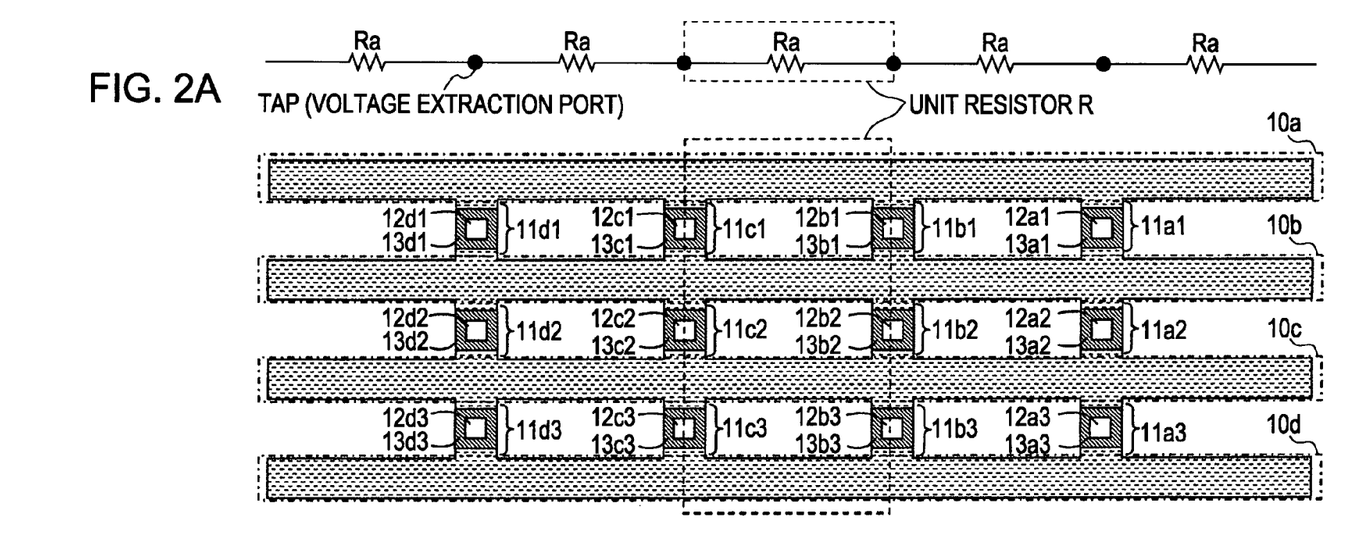
FIGS. 2A and 2B show the configuration of a ladder resistor provided in the A/D converter circuit shown in FIG. 1.
Figure 2B:
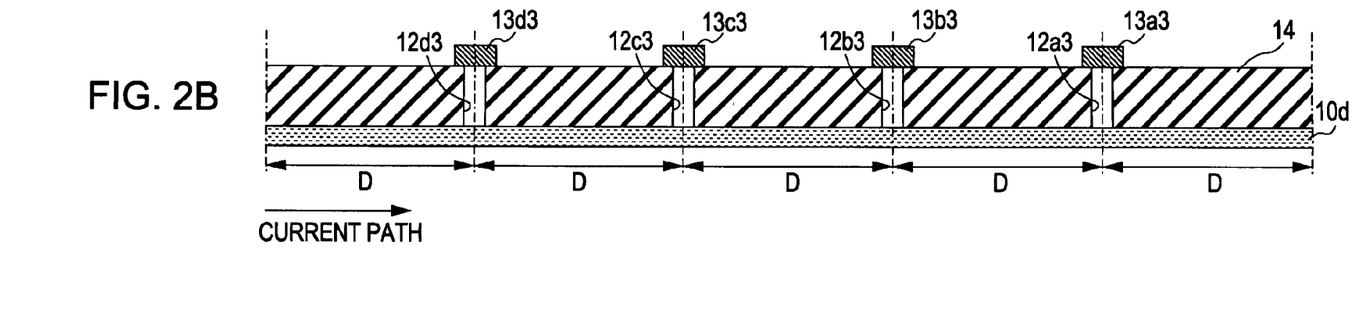

As the ladder resistor 1, after a polysilicide layer is formed on the semiconductor substrate, the polysilicide layer is patterned using a resist mask to form a polysilicide having a lattice configuration, as shown in FIGS. 2A and 2B.

The polysilicide having the lattice configuration includes a plurality of resistor portions 10a to 10d and a plurality of connection portions 11a1 to 11a3, 11b1 to 11b3, 11c1 to 11c3, and 11d1 to 11d3.

For the sake of convenience, in the following descriptions, any or all of the connection portions 11a to 11a3, 11b1 to 11b3, 11c1 to 11c3, and 11d1 to 11d3 may be referred to as connection portion(s) 11. In addition, for the sake of convenience, in the following descriptions, any or all of the resistor portions 10a to 10d may be referred to as resistor portion(s) 10.

The resistor portions 10 are regions serving as component elements of the resistors Ra of the ladder resistor 1 and serving as a current path when a voltage is applied in the longitudinal direction of the resistor portions 10. In addition, as shown in FIGS. 2A and 2B, the resistor portions 10a to 10d are arranged with predetermined spaces therebetween and are arranged such that both ends of the resistor portions 10a to 10d in the longitudinal direction are located on a line that intersects the longitudinal direction. In addition, the resistor portions 10a to 10d are arranged in the same elongated shape.

In addition, as shown in FIGS. 2A and 2B, the connection portions 11 connect the adjoining resistor portions 10 with regular spaces D in the longitudinal direction of the resistor portions 10. That is, the connection portions 11 are provided, with predetermined spaces D therebetween, between the resistor portions 10a and 10b, between the resistor portions 10b and 10c, and between the resistor portions 10c and 10d.

In addition, the connection portions 11a1 to 11a3, 11b1 to 11b3, 11c1 to 11c3, and 11d1 to 11d3 are connected to the voltage extraction portions 13a1 to 13a3, 13b1 to 13b3, 13c1 to 13c3, and 13d1 to 13d3 via the contacts 12a1 to 12a3, 12b1 to 12b3, 12c1 to 12c3, and 12d1 to 12d3. The voltage extraction portions are formed of metal wires. For the sake of convenience, in the following descriptions, any or all of the voltage extraction portions 13a1 to 13a3, 13b1 to 13b3, 13c1 to 13c3, and 13d1 to 13d3 may be referred to as voltage extraction portion(s) 13.

In addition, the voltage extraction portions 13 connected to the connection portions 11 located on a line extending in a direction that is orthogonal to the longitudinal directions of the resistor portions 10 are connected to each other. That is, the voltage extraction portions 13a1 to 13a3 are connected to each other. Similarly, the voltage extraction portions 13b1 to 13b3 are connected to each other, the voltage extraction portions 13c1 to 13c3 are connected to each other, and the voltage extraction portions 13d1 to 13d3 are connected to each other.

As described above, a resistor Ra, which is a unit resistor of the ladder resistor 1, has a configuration in which regions of the resistor portions 10a to 10d each having a length D are connected in parallel with each other with the connection portions 11 therebetween. For example, in a unit resistor R shown in FIGS. 2A and 2B, one ends of regions of the resistor portions 10a to 10d each having a length D are connected to each other with the connection portions 11b1 to 11b3 therebetween, and the other ends of the regions are connected to each other with the connection portions 11c1 to 11c3 therebetween. The connection portions 11b1 to 11b3 are connected to the voltage extraction portions 13b1 to 13b3 with the contacts 12b1 to 12b3 therebetween, and the connection portions 11c1 to 11c3 are connected to the voltage extraction portions 13c1 to 13c3 with the contacts 12c1 to 12c3 therebetween.

The ladder resistor 1 is formed on the semiconductor substrate by the process described below. That is, a patterned polysilicide layer is formed on the semiconductor substrate. An insulating layer 14 is formed on the polysilicide layer. Then, openings are formed in the connection portions on the insulating layer 14. The voltage extraction portions 13 are formed at the connection portions 11 by filling in metal at the openings. The voltage extraction portions 13 that are adjacent to each other in a direction that is orthogonal to the direction of a current path are connected to each other via metal wires.

As described above, in the semiconductor device according to this embodiment, voltage extraction portions are provided at connection portions that connect resistor portions, instead of being provided at the resistor portions serving as a current path. Thus, a reduction in the accuracy of acquisition of the voltage division ratio due to the variations in the metal wires and the contacts can be prevented. In addition, a unit resistor is formed of a plurality of resistor portions. Thus, the strength against bending stress can be increased, and the accuracy of acquisition of the resistance can be improved. In addition, a plurality of resistor portions are connected in parallel with each other, and many voltage extraction ports are provided. Thus, the resistance at each voltage extraction port can be reduced, and the settling time of a reference voltage in the A/D converter circuit is reduced, thus increasing the operation speed.

In this embodiment, the resistor portions and the connection portions are formed of an identical polysilicide layer. However, the resistor portions and the connection portions may be formed of different layers that are connected to each other. In addition, a plurality of ladder resistors shown in FIGS. 2A and 2B may be arranged in parallel with each other. In this case, voltage extraction ports (voltage extraction portions) that are located substantially orthogonal to the longitudinal direction of the ladder resistors may be connected to each other.

Figure 3:
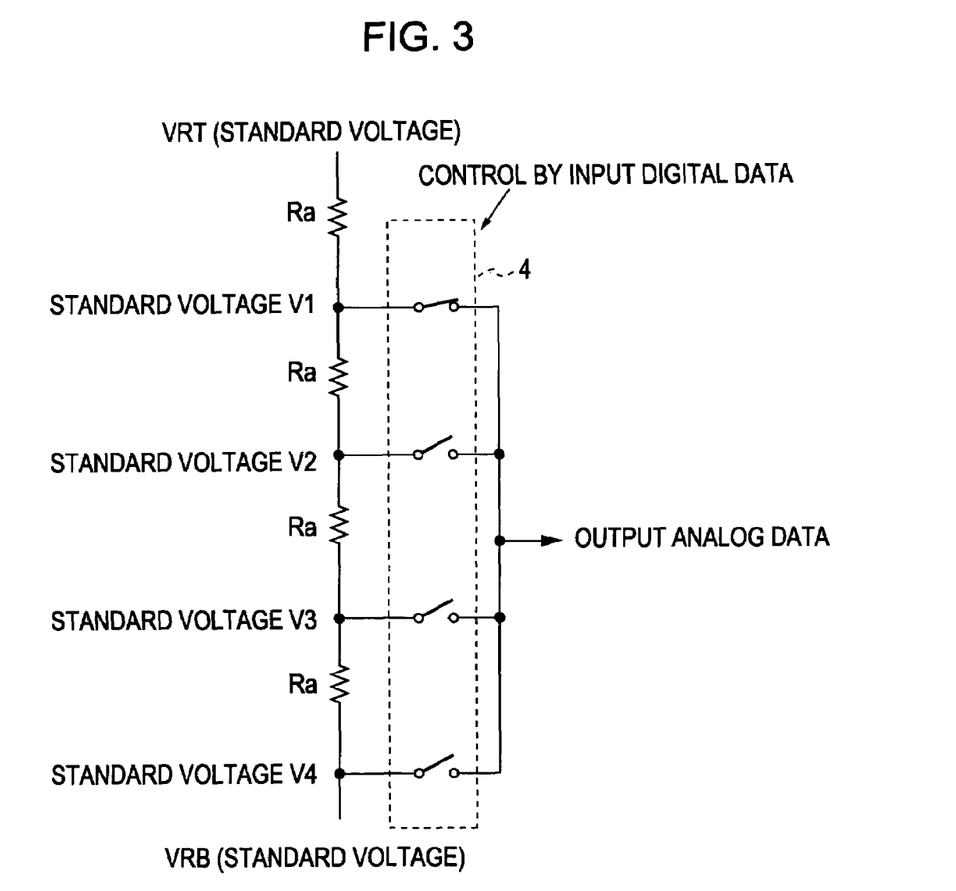
FIG. 3 shows the configuration of a D/A converter circuit according to an embodiment of the present invention.

In addition, the above-described ladder resistor 1 with high accuracy and with reduced stress can also be applied to a D/A converter circuit, similarly to the above-described A/D converter circuit. The semiconductor device including the D/A converter circuit will be described more specifically with reference to FIG. 3. FIG. 3 schematically shows the configuration of the D/A converter circuit.

The D/A converter circuit includes the ladder resistor 1 including a plurality of resistors Ra arranged in series with each other and a plurality of voltage extraction portions that extract voltages V1 to V4 across the resistors Ra as standard voltages and a switch portion 4 that selects one of the standard voltages V1 to V4 of the ladder resistor 1. The switch portion 4 is controlled by a controller, which is not shown.

When the standard voltages VRT and VTB are applied across the ladder resistor 1, a voltage of (VRT−VRB)/4 R is generated across each of the resistors Ra. The standard voltage V1 (V1=3(VRT−VRB)/4 R+VRB), the standard voltage V2 (V2=2(VRT−VRB)/4 R+VRB), the standard voltage V3 (V3=(VRT−VRB)/4 R+VRB), and the standard voltage V4 (V4=VRB) are acquired. The controller controls the switch portion 4 and outputs any one of the standard voltages V1 to V4 as analog data.

As described above, in the D/A converter circuit according to this embodiment, the ladder resistor 1 shown in FIGS. 2A and 2B is used as a standard voltage generator. Thus, a reduction in the accuracy of acquisition of the voltage division ratio due to the variations in the metal wires and the contacts can be prevented, and the strength against bending stress and the accuracy of acquisition of the resistance can be improved. In addition, a plurality of resistor portions are connected in parallel with each other and many voltage extraction ports are provided. Thus, the resistance of a voltage extraction port can be reduced, and the settling time of a standard voltage in the D/A converter circuit can be reduced, thus increasing the operation speed.

It should be understood by those skilled in the art that various modifications, combinations, sub-combinations and alterations may occur depending on design requirements and other factors insofar as they are within the scope of the appended claims or the equivalents thereof.

What is claimed is:

1. A semiconductor device comprising:
  a semiconductor substrate; and
  a ladder resistor formed on the semiconductor substrate,
    wherein the ladder resistor includes a plurality of elongated resistor portions arranged in parallel with each other, a plurality of connection portions that connect the resistor portions at predetermined intervals in a longitudinal direction of the resistor portions, and a plurality of voltage extraction portions provided in order to extract voltages at the individual connection portions,
    wherein the resistor portions and the connection portions are formed of an identical polysilicide layer formed on the semiconductor substrate.

2. The semiconductor device according to claim 1, wherein the voltage extraction portions provided at the connection portions located at positions along a direction that is substantially orthogonal to the longitudinal direction of the resistor portions are connected to each other.

3. The semiconductor device according to claim 1, further comprising:
  a converter circuit that converts analog data into digital data or that converts digital data into analog data and that is formed on the semiconductor substrate.

4. A semiconductor device comprising:
  a resistor having resistor portions, a first of the resistor portions being separated from a second of the resistor portions;
  connection portions connecting said first of the resistor portions with said second of the resistor portions, a voltage at one of the connection portions differing from a voltage at another of the connection portions,
    wherein said resistor portions and said connection portions are of a same material.

5. The semiconductor device according to claim 4, wherein a space separates said first of the resistor portions and said second of the resistor portions.

6. The semiconductor device according to claim 5, wherein said second of the resistor portions and a third one of the resistor portions are separated by another space.

7. The semiconductor device according to claim 6, wherein other connection portions connect said second of the resistor portions with said third one of the resistor portions, a voltage at a first of the other connection portions differing from a voltage at a second of the other connection portions.

8. The semiconductor device according to claim 7, wherein a voltage extraction portion connects said one of the connection portions with said first of the other connection portions.

9. The semiconductor device according to claim 8, wherein said voltage extraction portion is a metal wire.

10. The semiconductor device according to claim 4, wherein said first of the resistor portions is in parallel with said second of the resistor portions.

11. The semiconductor device according to claim 4, wherein said resistor portions extend along a longitudinal direction.

12. The semiconductor device according to claim 4, wherein said space is between said one of the connection portions and said another of the connection portions.

13. The semiconductor device according to claim 4, wherein said one of the connection portions is between said first of the resistor portions and said second of the resistor portions.

14. The semiconductor device according to claim 4, wherein a voltage at said another of the connection portions differs from a voltage at a different one of the connection portions.

15. The semiconductor device according to claim 4, wherein a lattice configuration includes said resistor and connection portions.

16. The semiconductor device according to claim 4, wherein said same material is a layer of polysilicide.

17. The semiconductor device according to claim 16, wherein said layer of polysilicide is on a semiconductor substrate.

18. A semiconductor device comprising:
  a converter circuit that converts analog data into digital data or that converts digital data into analog data, said converter circuit including a resistor in series with the resistor of claim 4.

* * * * *